(12) United States Patent
Sundstrom

(10) Patent No.: US 7,046,520 B2
(45) Date of Patent: May 16, 2006

(54) ELECTRONIC ASSEMBLIES HAVING SUPPORTS FOR CIRCUIT BOARDS

(75) Inventor: Lance L. Sundstrom, Pinellas Park, FL (US)

(73) Assignee: Honeywell International, Inc., Morristown, NJ (US)

( * ) Notice: Subject to any disclaimer, the term of this patent is extended or adjusted under 35 U.S.C. 154(b) by 316 days.

(21) Appl. No.: 10/409,435

(22) Filed: Apr. 7, 2003

(65) Prior Publication Data

US 2004/0196639 A1 Oct. 7, 2004

(51) Int. Cl.
H05K 7/12 (2006.01)

(52) U.S. Cl. .................. 361/769; 361/759; 361/801

(58) Field of Classification Search ............. 361/759, 361/724, 728, 725, 726, 727, 801, 802, 769
See application file for complete search history.

(56) References Cited

U.S. PATENT DOCUMENTS

| | | | | |
|---|---|---|---|---|
| 4,079,438 A | * | 3/1978 | Schmall | 361/759 |
| 4,109,300 A | * | 8/1978 | Reimer | 361/801 |
| 4,487,300 A | | 12/1984 | Hammond | |
| 4,583,149 A | * | 4/1986 | Ohlenburger | 361/705 |
| 4,730,237 A | * | 3/1988 | Locker | 361/740 |
| 4,867,235 A | * | 9/1989 | Grapes et al. | 165/185 |
| 5,128,833 A | * | 7/1992 | Lin et al. | 361/801 |
| 5,329,420 A | * | 7/1994 | Altoz | 361/709 |
| 5,847,923 A | * | 12/1998 | Lee | 361/684 |
| 6,038,131 A | * | 3/2000 | Valosen et al. | 361/756 |
| 6,312,275 B1 | * | 11/2001 | Tortorella | 439/341 |
| 6,804,124 B1 | * | 10/2004 | Takahashi | 361/798 |
| 2005/0013123 A1 | * | 1/2005 | Barr et al. | 361/759 |

FOREIGN PATENT DOCUMENTS

| | | | |
|---|---|---|---|
| DE | EP-0014391 | * | 1/1980 |
| DE | EP-0014391 | * | 8/1980 |
| EP | 0 014 391 A1 | | 8/1980 |
| EP | 0 200 597 A1 | | 11/1986 |
| EP | 1 033 909 A2 | | 9/2000 |
| FR | 2 595 180 A1 | | 9/1987 |
| GB | 2 103 020 A | | 2/1983 |
| GB | 2103020 | * | 2/1983 |

OTHER PUBLICATIONS

PCT International Search Report PCT/US2004/010785, Sep. 9, 2004.

* cited by examiner

*Primary Examiner*—Kamand Cuneo
*Assistant Examiner*—Yuriy Semenenko
(74) *Attorney, Agent, or Firm*—Ingrassia Fisher & Lorenz

(57) ABSTRACT

An electronic assembly apparatus is provided which has a chassis for housing at least one circuit board. The circuit board has at least one major surface. The chassis has at least one wall juxtapositioned along at least a portion of the major surface of the circuit board. The assembly also has at least one circuit board support member. The support member has a first end mechanically coupled to the major circuit board surface at an area between the first and second ends of the circuit board. The support member also has a second end mechanically coupled to the wall of the chassis. Another support member can be mechanically coupled between another major surface of the circuit board and another wall of the chassis. The support member or members provides support to the circuit board at an area between the first and second ends of the circuit board.

21 Claims, 5 Drawing Sheets

ELECTRONIC ASSEMBLIES HAVING SUPPORTS FOR CIRCUIT BOARDS

TECHNICAL FIELD

The present invention generally relates to electronic assemblies, and more particularly to support and heat sink structures for circuit boards.

BACKGROUND OF THE INVENTION

Modern electronic assemblies often have housings that enclose and support circuit boards, such as printed wiring assemblies (PWAs) in parallel or orthogonal relationships to each other. These assemblies generally can include multiple daughterboards with connectors that mate with connectors on a common motherboard. The daughterboards and motherboard are attached to and are supported by a common housing, or chassis. A daughterboard generally can include a printed wiring board (PWB) having one or more parallel patterned surfaces and/or buried conductive layers separated by insulating layers. The conductive layers are generally parallel to a major surface of the PWB.

A PWA can have components, such as heat sinks and subassemblies of various types mounted and connected to the patterned conductive paths and ground planes of an associated PWB. The PWAs and other circuit boards are often manufactured according to a particular standard that specifies physical and electrical parameters. One example of a well-known PWA standard is the Peripheral Component Interface (PCI) standard. As a result, the daughterboards and connectors thereof are electrically and mechanically compatible with the motherboard and supporting chassis to enable such daughterboards to be exchangeable with other daughterboards and to enable different manufacturers to provide the PWAs.

Electronic assemblies used in demanding environments such as for military, space and aerospace applications generally have stringent size, weight, shock, vibration and temperature cycling specifications. These specifications are set forth such that the electronic assemblies have a greater capability to survive extreme mechanical and thermal stress while maintaining optimal operational capability throughout the life cycle of the assembly. Mechanical forces, such as vibration and mechanical shock resulting from various sources, are often directly transferred to the PWAs or other circuit boards through the structure of the electronics assembly. Thus, it is desirable for PWA rigidity and clearance characteristics to prevent the components or other structures on adjacent PWAs from deflecting into each other or "rattling," which can cause undesirable secondary shock and vibration stresses.

In the past, a PWA has been typically supported in a housing or chassis only along two opposite edges of the associated PWB by edge supports that also act as card or board guides to facilitate guided insertion and extraction of the PWA and facilitate connector alignment. As a result, the central portions of such a prior art PWA are self-supporting. Relatively large PWAs have large surface areas and mass that are stiffened for suitability in a particular application such as space applications. For instance, increasing the thickness of the PWB and/or adding rib or frame supports to one or both major surfaces of the PWB has accomplished this stiffening in the past. These solutions can however result in an undesirable increase in size, weight, volume and cost of the assembly. Such metal rib and/or frame supports can also provide additional thermal conduction cooling paths between components and other structures mounted on the PWB and the board edges supported by the chassis. However the thermal resistance from centrally located components to such thermal paths at the supported edges of the PWBs of some prior art assemblies can be undesirably large resulting in the components thereof tending to have undesirably increased operating temperatures.

In view of the foregoing, it should be appreciated that there is a need to provide an apparatus for providing increased ruggedized mechanical support of circuit boards such as PWAs within a chassis. In addition, it is desirable for such apparatus to provide a minimum increase in volume, weight and cost. Moreover, it is desired that such apparatus provide improved or additional thermal paths between the circuit boards and the chassis. Furthermore, such apparatus is desirably compatible with industry standards relating to such assemblies. Furthermore, other desirable features and characteristics of the present invention will become apparent from the subsequent detailed description of the invention, brief summary of the invention, abstract, and appended claims, taken in conjunction with the accompanying drawings and the foregoing technical field and background of the invention.

BRIEF SUMMARY OF THE INVENTION

In accordance with an exemplary embodiment of the present invention, an electronic assembly is provided that has a chassis for housing at least one circuit board, which can be a PWA. The circuit board has at least one major surface. The chassis has at least one wall juxtapositioned along at least a portion of the major surface of the circuit board. The assembly also has at least one circuit board support member. The support member has a first end mechanically coupled to the major circuit board surface at an area between the first and second ends of the circuit board. The support member also has a second end mechanically coupled to the wall of the chassis. The support member thereby provides support to the circuit board at an area between the first and second ends of the board.

BRIEF DESCRIPTION OF THE DRAWINGS

The present invention will hereinafter be described in conjunction with the following drawing figures, wherein like reference numbers denote like elements, and.

DETAILED DESCRIPTION OF THE INVENTION

The following detailed description is merely exemplary in nature and is not intended to limit the invention or the application and uses of the invention. Furthermore, there is no intention to be bound by any theory presented in the preceding technical field, background of the invention, brief summary or the following detailed description.

Figure 1:
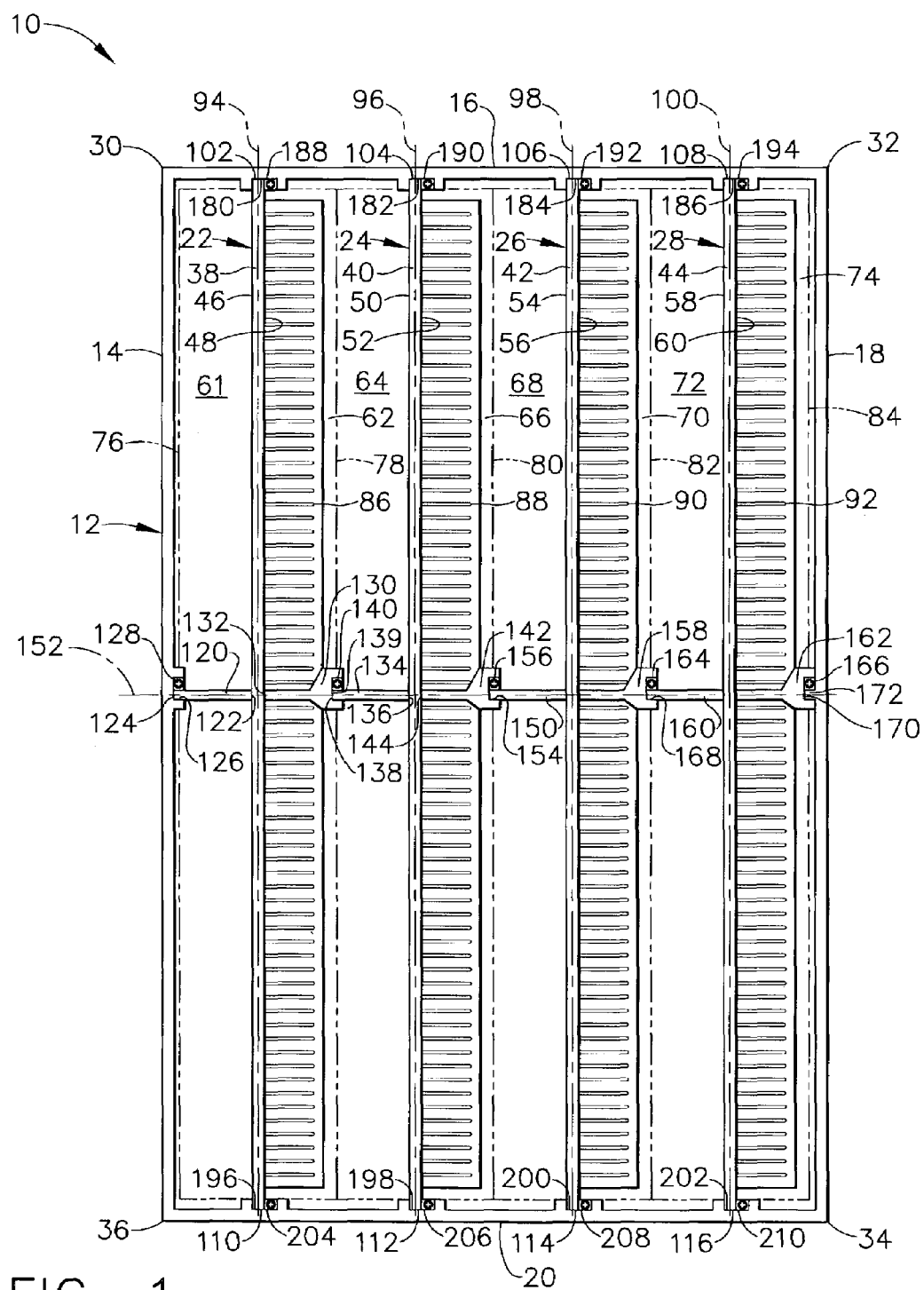
FIG. 1 is an insertion/extraction end view of an electronic chassis assembly including four daughterboard PWAs with interlocking PWA support members or guides mated with a supporting chassis in accordance with an exemplary embodiment of the present invention.

Referring to FIG. 1, a front or insertion/extraction end view of an electronic assembly 10 is shown. Electronic assembly 10 includes a chassis 12 having rectangular or square walls 14, 16, 18 and 20. However, other wall shapes can be used in accordance with the present invention. Chassis 12 houses and supports at least one circuit board that can have many configurations or forms. For purposes of illustration, a removable daughterboard in the form of PWAs 22, 24, 26 and 28 are shown in FIG. 1. Chassis 12 can be formed from machined metal. For example, aluminum sheets can be welded or otherwise fastened together at corners 30, 32, 34, and 36, as aluminum is a good conductor and radiator of heat. However, the chassis 12 can be formed of other metals, non-metals, or a combination of one or more metals or non-metals. Daughterboard PWAs such as 22, 24, 26 and 28 are inserted and removed from the front end of assembly 10 shown in FIG. 1. A motherboard that mates with the daughterboard PWAs can be located at the far end of assembly 10 in a known manner.

Each of daughterboard PWAs 22, 24, 26 and 28 has a respective PWB insulating layer 38, 40, 42 and 44. Each of these PWB insulating layers 38, 40, 42 and 44 has respective pairs of first and second major PWB surfaces 46 and 48, 50 and 52, 54 and 56, and 58 and 60, which are all preferably at least substantially parallel to each other. These surface layers and internal layers can each have patterned conductive metal layers (not shown) for interconnecting components and sub assemblies or other purposes such as providing power, ground and chassis planes for signal interconnect, power distribution, impedance control, shielding, thermal conduction, or the like. These components and sub assemblies can be located in a known manner on one or both sides of daughterboard PWAs 22, 24, 26 and 28 in the component volumes 61 and 62, 64 and 66, 68 and 70, and 72 and 74. Dashed lines 76, 78, 80, 82 and 84 designate the imaginary elevation boundaries for component volumes 61 and 62, 64 and 66, 68 and 70 and 72 and 74. Sets of right angle connector pins 86, 88, 90 and 92 are located at the far or rear ends of respective daughterboard PWAs 22, 24, 26 and 28 of FIG. 1. A second end or bottom edge view of a daughterboard PWA of FIG. 1 with an end view of one set of such connector pins is shown in and described with respect to FIG. 4. Daughterboard PWAs 22, 24, 26, and 28 each have respective axes 94, 96, 98, and 100 that preferably run at least substantially parallel to first and second major PWB surfaces 46 and 48, 50 and 52, 54 and 56, and 58 and 60. First and second chassis walls 14 and 18 are preferably juxtapositioned parallel to first and second major PWB surfaces 46 and 48, 50 and 52, 54 and 56, and 58 and 60. Each of daughterboard PWAs 22, 24, 26, and 28 has a respective first end 102, 104, 106, and 108 and a respective second end 110, 112, 114 and 116.

Daughterboard PWA first and second support and guide member pairs 120 and 130; 134 and 142; 150 and 158; and 160 and 162 interlock with each other to support the respective daughterboard PWAs 22, 24, 26 and 28 between chassis walls 14 and 18. These support members extend along axis 152 that is preferably at least substantially perpendicular to axes 94, 96, 98 and 100. Rectangular first support member 120 has a first end 122 mechanically coupled to the first major PWB surface 46 at an area between the first and second ends 102 and 110 of daughterboard PWA 22. This coupling is shown in and will be described with respect to FIG. 5. Second end 124 of first support member 120 is mechanically coupled in slot 126 associated with first chassis wall 14 by a wedge clamp 128. This coupling provides a primary mechanical and thermal interface between the central areas of the daughterboard PWAs 22, 24, 26 and 28 and the first chassis wall 14. The slot 126 runs along an axis, which extends into the view and which axis is preferably at least substantially perpendicular to axes 94 and 152. Slot 126 can be machined into first wall 14 of chassis 12. "C" shaped second support member 130 has a first end 132 mechanically coupled to second major PWB surface 48 of daughterboard PWA 22 at an area between ends 102 and 110. Similarly, rectangular first support member 134 has a first end 136 coupled to the first major PWB surface 50 of daughterboard PWA 24 at an area between ends 104 and 112. Second end 138 of first support member 134 is mechanically coupled in slot 139 of "C" shaped second support member 130 by another wedge clamp 140. Wedge clamp 140 is shown in and will be described with respect to FIG. 2. Another "C" shaped second support member 142 has a first end 144 mechanically coupled to second major PWB surface 52 of daughterboard PWA 24 between ends 104 and 112.

Likewise rectangular first support member 150 is secured in slot 154 of "C" shaped second support member 142 by edge clamp 156. "C" shaped second support members 158 and 162 have respective slots 168 and 170. Also rectangular first support member 160 and "C" shaped second support member 162 secure daughterboard PWA 28 between second support member 158 and second chassis wall 18 by the utilization of edge clamps 164 and 166, slots 168 and 170 and protrusion 172 extending from second chassis wall 18. The mechanical coupling of second support member 162 to protrusion 172 from second chassis wall 18 forms another primary mechanical and thermal interface enabling heat to be dissipated from the central areas of the daughterboard PWAs through the support members and chassis 12.

The first and second support members 120, 130, 134, 142, 150, 158, 160 and 162 cooperate with each other to provide increased mechanical support to daughterboard PWAs 22, 24, 26, and 28 at areas between the ends thereof. This support in effect stiffens and enables the assembly to be used in demanding environments such for military, space and aerospace applications, which have stringent size, weight, shock, vibration and temperature cycling specifications for the assembly 10. The added PWA rigidity and the clearance characteristics of assembly 10 shown in FIG. 1 prevent the components or other structures on adjacent daughterboard PWAs 22, 24, 26, and 28 from deflecting into each other or "rattling."

First and second support members 134, 142, 150, 158, 160 and 162 cooperate with each other to mechanically couple second support member 130 to second chassis wall 18. This mechanical coupling also provides thermal conduction paths through the support members for heat generating components or subassemblies located centrally on the daughterboard PWAs. Daughterboard PWA first ends 102, 104, 106 and 108 are coupled to third chassis wall 16 in slots 180, 182, 184 and 186 by respective wedge clamps 188, 190, 192 and 194. Moreover, daughterboard PWA second ends 110, 112, 114 and 116 are coupled to fourth chassis wall 20 in slots 196, 198, 200, and 202 by respective wedge clamps 204, 206, 208 and 210 as shown in FIG. 1. The daughterboard PWA support members can be preferably formed made from extruded aluminum that is lightweight and has good heat conduction characteristics. However, other metals, non-metals or a combination thereof can be used in accordance with the present invention.

Each of daughterboard PWAs 22, 24, 26, and 28 can be removed from chassis 12 by loosening the wedge clamps associated therewith. Slot 126 of first chassis wall 14 and slot 139 of second support member 130 provides guides for reinsertion of daughterboard PWA 22, for instance. Another daughterboard PWA manufactured to the same standard as daughterboard PWA 22 can be inserted into chassis 12 by attaching first and second support members such as 120 and 130 to the other daughterboard PWB in a manner to be described with respect to FIG. 5. Slot 126 of first chassis wall 14 and the slots 139, 154, 168 and 170 in "C" shaped second support members 130, 142, 158 and 162 serve as guides for facilitating the insertions and extractions of daughterboard PWAs 22, 24, 26 and 28 to and from chassis 12.

Figure 2:
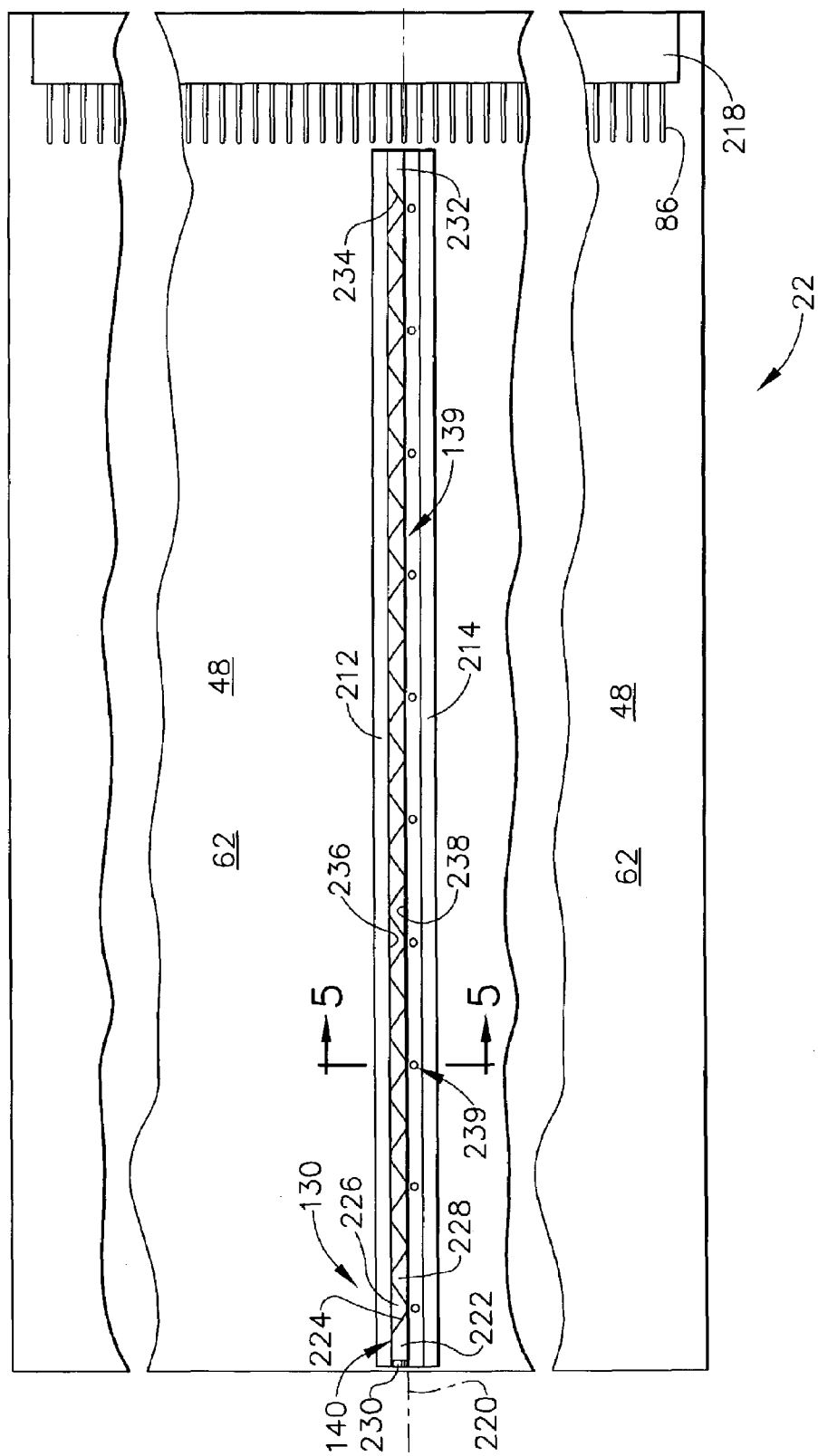
FIG. 2 is a right side or second major PWB surface view of a daughterboard PWA of FIG. 1 showing the structure of a wedge clamp for securing a PWA support member to an adjacent PWA support member or to a chassis wall protrusion in accordance with an exemplary embodiment of the present invention.

FIG. 2 shows a right side or second major PWB major surface view of daughterboard PWA 22 of FIG. 1 that is removed from chassis 12 for illustrating the structure and operation of wedge clamp 140, which can be of a known form that is used in prior art assemblies, for instance. The second major PWB surface 48 of daughterboard PWA 22 is shown in FIG. 2 along with component volume 62. In addition, FIG. 2 shows a side view of connector pins 86, which are part of PWB connector 218. The view shown in FIG. 2 also shows the second end of "C" shaped second support member 130 that is hidden in FIG. 1, for instance. Surface 212 is one outer surface of the second end of second support member 130 and surface 214 is another outer surface of the second end of second member 130, both of which are preferably at least substantially parallel to axis 220. Previously mentioned slot 139 runs along (i.e., parallel to) axis 220 which preferably extends substantially perpendicular to axes 94 and 152 and at least substantially parallel to the axis of slot 126 of first chassis wall 14 of FIG. 1. Thus, slot 139 also runs at least substantially parallel to or along first major PWB surface 46 of daughterboard PWA 22. Wedge clamp 140 extends along axis 220 approximately the length of slot 139 of "C" shaped second support member 130. Wedge clamp 140 includes an end piece 222 having a sloped surface 224. A plurality of separate wedge pieces 226 preferably point in one direction at least substantially perpendicular to axis 220 and another plurality of separate wedge pieces 228 point in the opposite direction. Wedge pieces 226 and 228 and piece 222 are all located on a shaft (not shown) which is located inside the wedge pieces and which extends along axis 220. Threaded piece 232 has a sloped surface 234. The shaft has slotted head 230 on one end and a threaded portion at the other end for screwing into threaded piece 232. As head 230 is turned to screw into piece 232 the available shaft length decreases thereby forcing the wedges 226 and 228 to slide with respect to each other and increase the distance between wedge clamp surfaces 236 and 238. Alternatively, as head 230 is turned to screw out of piece 232 the available shaft length increases thereby enabling the wedges 226 and 228 to slide with respect to each other decreasing the distance between wedge clamp surfaces 236 and 238. This allows the wedge clamp 140 to either apply or remove clamping pressure on the second end of a first support member of an adjacent daughterboard PWA or on protrusion 172 from second chassis wall 18 inserted into slot 170 of "C" shaped second support member 162. The other wedge clamps of FIG. 1 operate in a similar manner to enable the removal and insertion of the daughterboard PWAs. Since the second end of a rectangular first support member such as 134 of FIG. 1 is not interlocked with the second support member structure 130 shown in FIG. 2, the end 239 of one of a plurality of screws such as screw 300 shown in FIG. 5 are revealed in FIG. 2.

Figure 3:
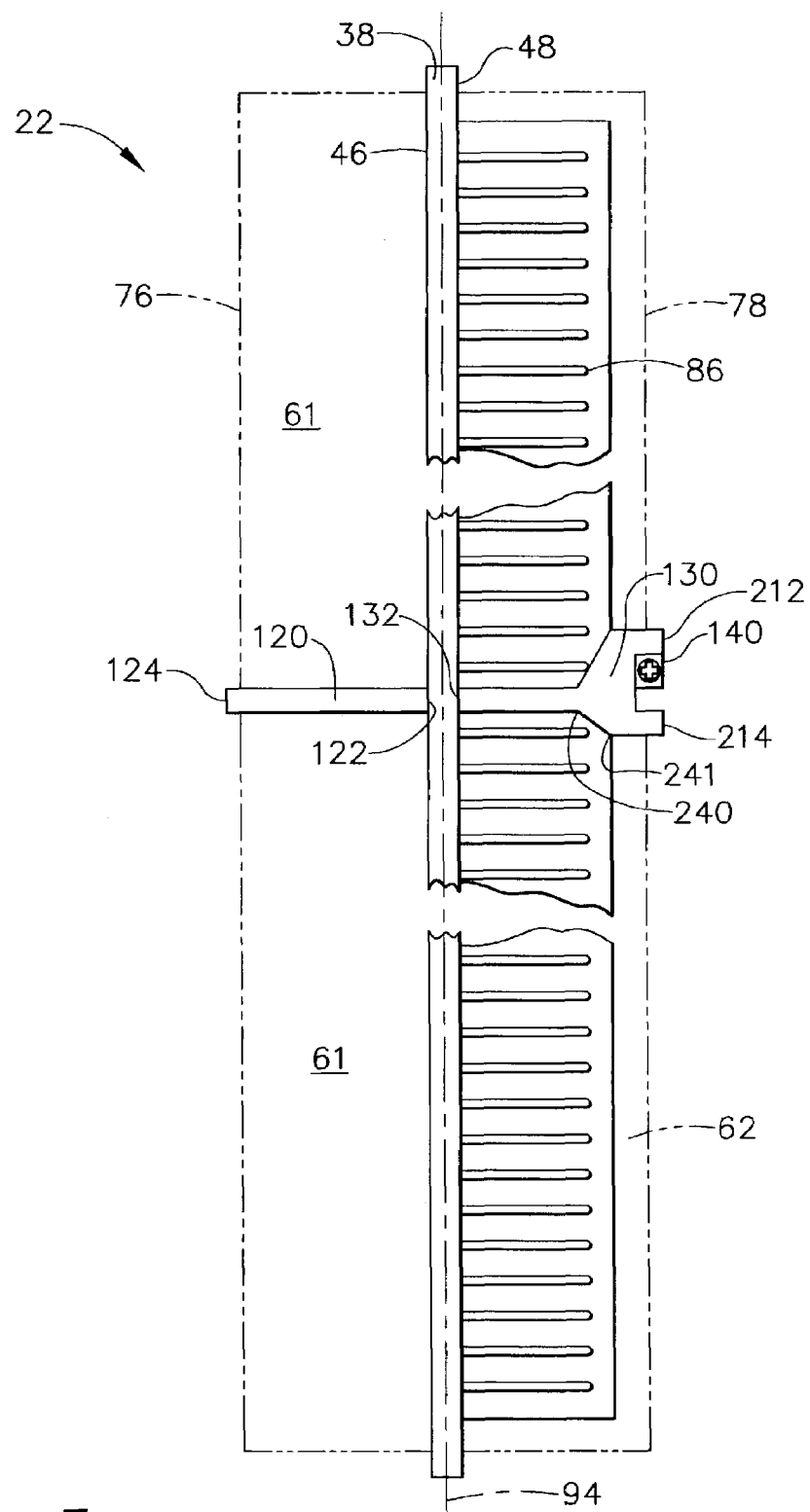
FIG. 3 is a rear edge view of a daughterboard PWA of FIG. 1 with support members or guides in accordance with an exemplary embodiment of the present invention.

FIG. 3 shows a rear end view of daughterboard PWA 22 of FIG. 1 when removed from chassis 12. Second end 124 of rectangular first support member 120 is unclamped from slot 126 of first chassis wall 14 by loosening wedge clamp 128. Furthermore, the second end of the "C" shaped second support and guide member 130 is unclamped from the second end 138 of rectangular first support member 134 by loosening wedge clamp 140. Likewise, first and second ends 102 and 110 of daughterboard PWA 22 are unclamped from the third and forth chassis walls 16 and 20 by loosening wedge clamps 188 and 204 of FIG. 1. Another view of the component volumes 61 and 62 and connector pins 86 is provided by FIG. 3. Insulating portion 38 having metal patterns thereon with components mounted thereon in known manner (not shown) can be manufactured to a particular board standard. First and second support members 120 and 130 can then be attached to any such standard board and then inserted into chassis 12.

Figure 4:
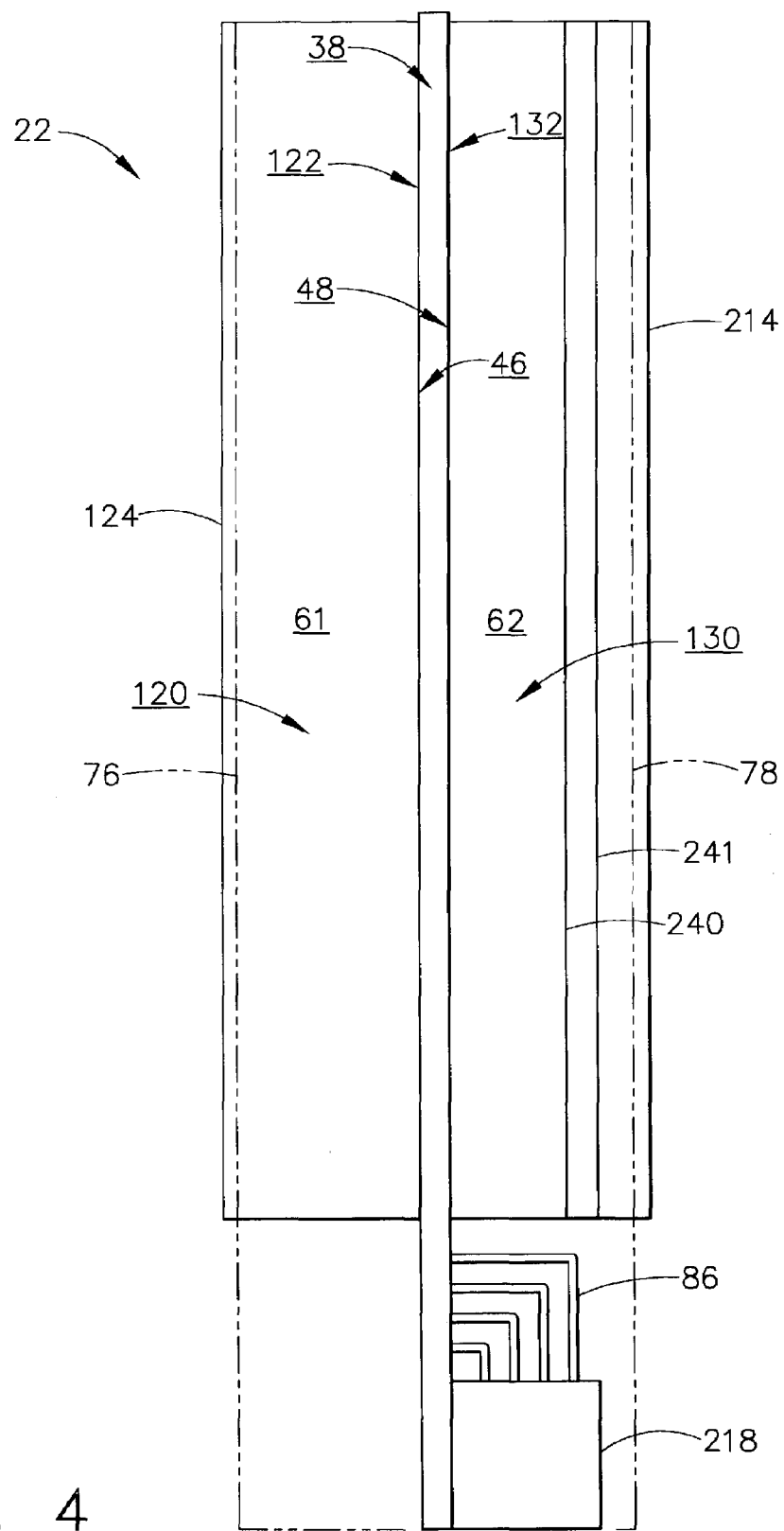
FIG. 4 is a second end or bottom edge view of a daughterboard PWA of FIG. 1 with a connector and support members or guides in accordance with an exemplary embodiment of the present invention.

FIG. 4 is a second end 110 view of daughterboard PWA 22 of FIG. 1. More specifically, viewing FIGS. 3 and 4 from left to right, reference number 124 designates the second end surface of rectangular shaped first support member 120. Boundary 76 of component volume 61 preferably runs at least substantially parallel to second end surface 124. The bottom of insulating layer 38 and first and second major PWB surfaces 46 and 48 are shown in FIG. 4. The first end 122 of rectangular first support member 120 abuts first major PWB surface 46. The first end 132 of "C" shaped second support member 130 abuts second major PWB surface 48. Lines 240 and 241 indicate the edges of the angle portion of "C" shaped second support member 130. Boundary 78 of component volume 62 preferably runs at least substantially parallel to line 240 and to the second end surface 214 of second support member 130. Right angle connector pins 86 of connector 218 is shown as being connected to major PWB surface 48 as a surface mount or to both major PWB surfaces 46 and 48 as a through-hole.

Figure 5:
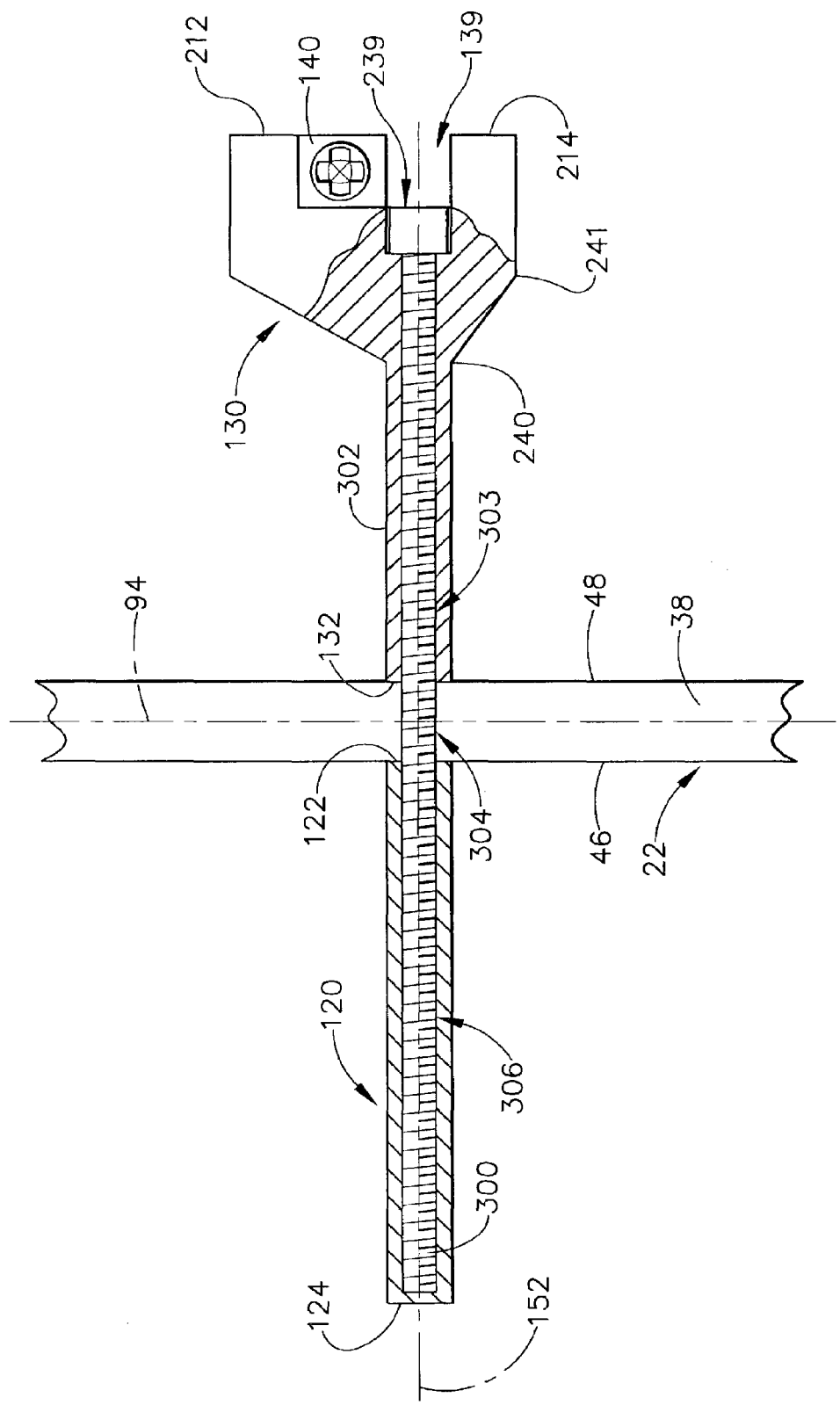
FIG. 5 is a cross-section view of a portion of the daughterboard PWA structure of FIG. 2 showing the attachment of support members or guides to the first and second major PWB surfaces of a PWA in accordance with an exemplary embodiment of the present invention.

FIG. 5 is a cross section of FIG. 2 along line 5-5 at end or head 239 of screw 300, which mechanically couples first and second support members 120 and 130 to the PWB 38 of daughterboard PWA 22. The cross section of first end portion 122 of first support member 120 runs along axis 152. Second support member 130 includes a cross section portion 302 that also runs along axis 152. Screw 300 extends along axis 152 through a clearance hole 303 in second support member 130, another clearance hole 304 in the PWB 38 of daughterboard PWA 22 and into threaded hole 306 of first support member 120. The head 239 of screw 300 is countersunk in slot 139 of second support member 130. Screw 300 also could have been run from first support member 120 into second support member 130 with head 239 countersunk into second end 124 of first support member 120. Screw 300 and first and second support members 120 and 130 are affixed to the PWB 38 of daughterboard PWA 22 before daughterboard PWA 22 is inserted into chassis 12. The abutment of first and second support members 120 and 130 against metal patterns (not shown for the sake of simplicity)

on first and second major PWB 38 surfaces 46 and 48 enables heat to be conducted from an energized and operating daughterboard PWA 22 when inserted and wedge clamped into chassis 12 as shown in FIG. 1. The heat can be conducted through the first and second support members 120 and 130 to first and second chassis walls 14 and 18 where the heat can be further dissipated or radiated. Heat can be also conducted from first and second ends 102 and 110 of PWA 22 to the third and forth chassis walls 16 and 20. The above described utilization of the support members 120 and 130 enables assembly 10 to be lighter in weight and to take up less space than if ribs or frames were installed to support and heat sink the PWA 22 only from its first and second ends 102 and 110, for instance.

In view of the foregoing, a ruggedized apparatus 10 has been described which provides increased mechanical support to circuit boards such as daughterboard PWAs 22, 24, 26, and 28 within chassis 12 by the use of interlocking first and second support and guide members. Apparatus 10 provides a minimum increase in volume, weight and cost. Moreover, the first and second support members of apparatus 10 provide improved or additional thermal paths between the daughterboard PWAs 22, 24, 26, and 28 and chassis 12. In addition, apparatus 10 enables daughterboard PWAs 22, 24, 26, and 28 to each be compatible with industry standards relating to such PWAs.

While at least one exemplary embodiment has been presented in the foregoing detailed description, it should be appreciated that a vast number of variations exist. It should also be appreciated that these exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the spirit and scope of the invention as set forth in the appended claims and the legal equivalents thereof.

What is claimed is:

1. An electronic assembly having a chassis for housing at least one circuit board, the circuit board having first and second major surfaces and the circuit board also having first and second ends, wherein the first and second major surfaces of the circuit board run parallel to each other along a first axis, and the chassis having at least first and second walls respectively juxtapositioned along at least portions of the first and second major surfaces of the circuit board, the assembly including in combination:

first circuit board support member means having a first end and a second end, said first end mechanically coupled to the first major surface of the circuit board between the first and second ends of the circuit board and said second end mechanically coupled to the first wall of the chassis;

second circuit board support member means having a first end and a second end, said first end mechanically coupled to the second major surface of the circuit board between the first and second ends of the circuit board, and said second end including a slot formed therein running parallel to said second major surface of the circuit board;

third circuit board support member means having a first end and a second end, said first end being located in said second circuit board support member means slot;

a slot in said first wall, said first wall slot running along a second axis that is substantially perpendicular to the first axis and substantially parallel to the first major surface of the circuit board and said second end of said first circuit board support member means being located in said slot; and first fastening means also being located in said first wall slot, said first fastening means attaching said second end of said first circuit board support member means to the first wall of the chassis;

said first, second, and third circuit board support member means cooperating with each other to attach the circuit boards to the chassis to thereby provide mechanical support to the circuit boards between the first and second ends thereof.

2. The electronic assembly of claim 1 having a circuit board that creates heat between the first and second ends thereof when operational, wherein:

the chassis being formed from a metal;

said first and second circuit board support member means being formed of a heat conductive material; and said first and second circuit board support member means conducting at least some of the heat from the circuit board to the chassis.

3. The electronic assembly of claim 1 wherein said first fastening means includes:

a wedge clamp;

said wedge clamp being capable of being tightened to facilitate the securing of said first circuit board support member means and the circuit board to the chassis; and said wedge clamp being capable of being loosened to facilitate the removal of said first circuit board support member means and the circuit board from the chassis.

4. The electronic assembly of claim 1 further including:

second fastening means also being located in said second circuit board support member means slot, said second fastening means attaching said second end of said second circuit board support member means to said third circuit board support member means; and means mechanically coupling said third circuit board support member means to the second wall of the chassis.

5. The electronic assembly of claim 4 wherein:

said second fastening means includes a wedge clamp:

said wedge clamp being capable of being tightened to facilitate the securing of said second circuit board support member means to said third circuit board support member means; and said wedge clamp being capable of being loosened to facilitate the removal of said second circuit board support member means from said third circuit board support member means.

6. The electronic assembly of claim 1 further including: mechanical means for coupling together said first circuit board support member means, said second circuit board support member means and the circuit board.

7. The electronic assembly of claim 6 wherein:

the first and second major surfaces of the circuit board run parallel to each other along a first axis;

said first circuit board support member means includes a portion that runs along a second axis perpendicular to said first axis;

said second circuit board support member means includes a portion that also runs along said second axis; and said mechanical means extending along said second axis through said portions of said first support member means and said second support member means and the circuit board to couple together said first support member means, said second support member means and the circuit board.

8. The electronic assembly of claim 7 wherein said mechanical means includes a screw.

9. An electronic assembly having a chassis for housing at least first and second printed wiring assemblies, each printed wiring assembly having first and second major printed wiring board surfaces that run parallel to each other and to a first axis, each printed wiring assembly having first and second ends, and the chassis having a first wall juxtapositioned along at least a portion of the first major printed wiring board surface of the first printed wiring assembly and a second wall juxtapositioned along at least a portion of the second major printed wiring board surface of the second printed wiring assembly; the assembly including in combination:

a first printed wiring assembly support member having a first end mechanically coupled to the first major printed wiring board surface of the first printed wiring assembly between the first and second ends of the printed wiring assembly, said first printed wiring assembly support member having a second end mechanically coupled to the first wall of the chassis;

a second printed wiring assembly support member having a first end mechanically coupled to the second major printed wiring board surface of the first printed wiring assembly between the first and second ends of the first printed wiring assembly, said second printed wiring assembly support member having a second end having a slot running parallel to said second major printed wiring board surface of said first printed wiring assembly;

a third printed wiring assembly support member having a first end mechanically coupled to the first major printed wiring board surface of the second printed wiring assembly between the first and second ends of the second printed wiring assembly, said third printed wiring assembly support member having a second end mechanically coupled to said second printed wiring assembly support member slot;

a fourth printed wiring assembly support member having a first end mechanically coupled to the second major printed wiring board surface of the second printed wiring assembly between the first and second ends of the second printed wiring assembly, said fourth printed wiring assembly support member having a second end mechanically coupled to the second wall of the chassis;

said first, second, third and fourth printed wiring assembly support members cooperating with each other to attach said first and second printed wiring assemblies to the first and second chassis walls to thereby provide support to the first and second printed wiring assemblies between the first and second ends thereof;

a slot in the first wall of the chassis, said first wall slot running along an axis that is substantially parallel to the first major printed wiring board surface of the first printed wiring assembly, said second end of said first printed wiring assembly support member being located in said first wall slot; and a first fastener also being located in said first wall slot, said first fastener attaching said second end of said first printed wiring assembly support member to the first wall of the chassis.

10. The electronic assembly of claim 9 including printed wiring assemblies that create heat between the first and second ends thereof when operational, wherein:

the chassis is formed from a metal;
said first, second, third and fourth printed wiring assembly support members being formed of heat conductive material; and
said first, second, third and fourth printed wiring assembly support members conducting at least some of said heat from the printed wiring assemblies to the chassis.

11. The electronic assembly of claim 9 wherein said first and third printed wiring assembly support members each have a portion with a rectangular cross sectional shape having first and second ends.

12. The electronic assembly of claim 11 wherein:
said second printed wiring assembly support member slot is rectangular; and
said rectangular slot in said second printed wiring assembly support member being adapted to receive said rectangular portion of said second end of said third printed wiring assembly support member.

13. The electronic assembly of claim 9 wherein said first fastener includes:
a wedge clamp;
said wedge clamp being capable of being tightened to facilitate securing said first printed wiring assembly support member and the first printed wiring assembly to the first wall of the chassis; and
said wedge clamp being capable of being loosened to facilitate removal of said first printed wiring assembly support member and the first printed wiring assembly from the chassis.

14. The electronic assembly of claim 9 further including:
a second fastener also being located in said second printed wiring assembly support member slot, said second fastener attaching said second end of said second printed wiring assembly support member to said third printed wiring assembly support member.

15. The electronic assembly of claim 14 wherein said second fastener includes a wedge clamp.

16. The electronic assembly of claim 9 further including a third fastener for coupling together: said first printed wiring assembly support member, said second printed wiring assembly support member and the printed wiring assembly.

17. The electronic assembly of claim 16 wherein:
said first printed wiring assembly support member includes an end portion that runs parallel to a second axis that is perpendicular to said first axis;
said second printed wiring assembly support member includes an end portion that also runs along said second axis; and
said third fastener extends along said second axis through portions of said first printed wiring assembly support member, said second printed wiring assembly support member and the first printed wiring assembly.

18. An electronic assembly having a chassis for housing at least one circuit board, the circuit board having first and second ends and a first and a second major surface that run parallel to each other along a first axis, and the chassis having at least one wall juxtapositioned along at least a portion of the major surface of the circuit board between the first and second ends of the circuit board; the assembly including in combination:

a first circuit board support member having a first end mechanically coupled to the major surface of the circuit board between the first and second ends of the circuit board, said first circuit board support member means having a second end;

the wall having a slot running along another axis that is perpendicular to said first axis and parallel to said first major surface of the board;

said second end of said first circuit board support member being located in said slot;

a first fastener also being located in said slot, said first fastener attaching said second end of said first circuit support member to the wall of the chassis;

said first circuit board support member thereby attaching the circuit board to the chassis to provide mechanical support to the circuit board between the first and second ends thereof;

a second circuit board support member having a first end mechanically coupled to the second major surface of the circuit board at an area on said second major surface between the first and second ends of the circuit board, said second circuit board support member having a second end having a slot running parallel to said second major surface of the circuit board; and a third support member being located in said second circuit board support member slot.

19. The electronic assembly of claim 18 wherein said first fastener includes;

a wedge clamp;

said wedge clamp being capable of being tightened to facilitate securing the said first circuit board support member and the circuit board to the chassis; and said wedge clamp being capable of being loosened to facilitate removal of said first circuit board support member and the circuit board from the chassis.

20. The electronic assembly of claim 18 wherein the circuit board creates heat when operational, and the chassis having at least first and second walls, the first wall and the second wall being respectively juxtapositioned along at least portions of the first and second major surfaces of the circuit board; the electronic assembly, wherein said second end of said second circuit board support member is mechanically coupled to the second wall of the chassis; and said first and said second circuit board support members are formed of heat conducting material, said first and said second circuit board support members cooperating with each other to provide mechanical support to the circuit board between the first and second ends of the circuit board and to provide a heat conducting path from the circuit board to the chassis.

21. The electronic assembly of claim 20 further including:

a second fastener also being located in said second circuit board support member slot, said second fastener attaching said second end of said second circuit support member to said third support member; and a further structure mechanically coupling said third support member to said second wall of the chassis.

* * * * *